(12) United States Patent
Vasilache et al.

(10) Patent No.: US 8,027,380 B2
(45) Date of Patent: Sep. 27, 2011

(54) METHOD AND APPARATUS FOR FAST NEAREST NEIGHBOR SEARCH FOR VECTOR QUANTIZERS

(75) Inventors: Adriana Vasilache, Tampere (FI); Lasse Juhani Laaksonen, Nokia (FI); Mikko Tapio Tammi, Tampere (FI); Anssi Sakari Ramo, Tampere (FI)

(73) Assignee: Nokia Corporation, Espoo (FI)

( * ) Notice: Subject to any disclaimer, the term of this patent is extended or adjusted under 35 U.S.C. 154(b) by 10 days.

(21) Appl. No.: 12/503,269

(22) Filed: Jul. 15, 2009

(65) Prior Publication Data

US 2010/0014577 A1 Jan. 21, 2010

Related U.S. Application Data

(60) Provisional application No. 61/081,671, filed on Jul. 17, 2008.

(51) Int. Cl.
*H04B 1/66* (2006.01)
(52) U.S. Cl. ......................... 375/240; 704/222
(58) Field of Classification Search .............. 341/50, 341/51, 79, 106; 704/207, 219, 222, 230, 704/500; 375/240, 295; 382/240, 253; 381/31, 381/35, 36, 43
See application file for complete search history.

(56) References Cited

U.S. PATENT DOCUMENTS

| | | | |
|---|---|---|---|
| 4,907,276 A * | 3/1990 | Aldersberg | .................. 704/222 |
| 5,870,405 A | 2/1999 | Hardwick et al. | |
| 6,131,084 A | 10/2000 | Hardwick | |
| 6,836,225 B2 | 12/2004 | Lee et al. | |

FOREIGN PATENT DOCUMENTS

| | | |
|---|---|---|
| EP | 0577488 | 1/1994 |
| WO | 2008049737 A1 | 5/2008 |

OTHER PUBLICATIONS

Kohata, M. et al., "Vector quantization with Hyper-columnar cluster", in Proc. IEEE Int. Conf. on Acoustics, Speech, and Signal Processing (ICASSP'94), vol. 1, pp. I-489-I-492, Apr. 19-22, 1994.
Gray, R.M., "Vector quantization", IEEE ASSP Magazine, pp. 4-29, Apr. 1984.
Ragot, S. et al.; "Low-coomplexity multi-rate lattice vector quantization with application to wideband TCS speech coding at 32 kbit/s"; Acoustics, Speech, and Signal PRocessing, 2004, Proceedings (ICASSP '04). vol. 1; May 17-21, 2004.
Ragot, S. et al.; "Hexacode-based quantization of the Gaussian source at 1/2 bit per sample"; IEEE Transactions on Communications; vol. 49, No. 12, pp. 2056-2058, 2001.
Vardy, A., et al.; "More efficient soft decoding of the Golay codes"; IEEE Transactons on Information Theory, vol. 37, Issue 3, May 1991, pp. 667-672.
Ragot, S. et al.; "Low-complexity multi-rate lattice vector quantization with application to wideband TCS speech coding at 32 kbit/s"; Acoustics, Speech, and Signal PRocessing, 2004, Proceedings (ICASSP '04). vol. 1; May 17-21, 2004.

(Continued)

*Primary Examiner* — Joseph Lauture
(74) *Attorney, Agent, or Firm* — Nokia Inc.

(57) ABSTRACT

A method comprises identifying a component k of a codevector from a codebook C having one or more codevectors, the component k introducing highest variance for an input vector; allowing ordering of codevectors in the codebook C; and searching for a best match vector for the input vector using ordered codevectors.

18 Claims, 6 Drawing Sheets

OTHER PUBLICATIONS

"International Search Report and the Written Opinion of the International Searching Authority", in corresponding PCT Application No. PCT/FI2009/050603, Dated Nov. 17, 2009, 16 pages.

Poggi, G., Sasso, E.; "Codebook Ordering Techniques for Address-Predictive VQ", Acoustics, Speech, and Signal Processing, ICASSP-93., vol. 5, Apr. 27-30, 1993, pp. 586-589, Napoli, Italy.

Poggi, G.; "Fast Algorithm for Full-Search VQ Encoding", Electronics Letters, vol. 29, Issue 12, Jun. 10, 1993 pp. 1141-1142.

* cited by examiner

METHOD AND APPARATUS FOR FAST NEAREST NEIGHBOR SEARCH FOR VECTOR QUANTIZERS

RELATED APPLICATION

This application claims the priority of U.S. Provisional Application No. 61/081,671 filed Jul. 17, 2008.

FIELD OF INVENTION

This invention relates to encoding and decoding of audio data. In particular, the present invention relates to fast searching for nearest neighbor for vector quantizers.

BACKGROUND OF THE INVENTION

[This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Quantization is one of the main tools of lossy signal compression. The quantization process consists of finding, for a given input data, a close representative that would enable the storage or transmission of the data with less bits. A quantization function can be written as f :D->C where D is the input space and C is the set of representatives, or the codebook. For a given input from D, a representative, or codeword, is selected from C, such that a given distortion measure between the input and the representative is minimized over the entire codebook. The process of finding the codeword minimizing the distortion measure is usually called the nearest neighbor search.

If the input space, as well as the codebook, is one-dimensional, the quantization is called scalar quantization; otherwise it is called vector quantization. The representatives are also called codevectors in the case of vector quantization.

The cardinality of the codebook, $C_C$, is smaller than that of the input space, allowing the representation of the input data on fewer bits. The index, in the codebook, of the nearest neighbor codeword, could be represented on $\log_2 C_C$ bits. The quantization rate, if all the codewords were represented with the same number of bits, is $R=\log_2 C_C/K$ bits per sample, where K is the data dimension.

Generally, the nearest neighbor search involves the evaluation of the distortion measure for each codeword, which, especially for the vector quantization case, may be very expensive from the computational point of view. Various fast nearest neighbor algorithms have been proposed, that reduce the number of distortion evaluations based on one or more conditions to stop the evaluations.

Vector quantization is a tool extensively used in signal processing applications, for example in applications employing speech/audio, image or video coding.

SUMMARY OF THE INVENTION

In one aspect of the invention, a method comprises identifying a component k of a codevector from a codebook C having one or more codevectors; and allowing ordering of codevectors in the codebook C based on component k to facilitate searching for a best match vector for the input vector using ordered codevectors.

In one embodiment, the component k is identified as introducing highest variance for an input vector.

In one embodiment, the allowing ordering of codevectors includes sorting the codevectors in the codebook C according to component k. In another embodiment, the allowing ordering of codevectors includes providing a mapping function to form codevector indices of the codebook C.

In another aspect, a method comprises searching for a best match vector for an input vector using ordered codevectors in a codebook C, wherein the codevectors are ordered based on a component k of the codevector, wherein the searching comprises performing a binary search only considering component k of the input vector; and performing a modified partial distortion search considering full codevectors. The codevectors may be ordered in ascending order, and performing the binary search may find a vector with smallest index j satisfying the condition:

$$X_k < C_{j,k},$$

where X is the input vector and C' is the ordered codevectors.

In one embodiment, performing the modified partial distortion search comprises performing a downward search starting at index j−1; and performing an upward search starting at index j. The downward search may be terminated upon finding a codevector resulting in a larger distortion for component k than the then-current codevector providing the best match. The upward search may be terminated upon finding a codevector resulting in a larger distortion for component k than the then-current codevector providing the best match.

In one embodiment, the method further comprises selecting a codevector as the output of the searching for a best match upon termination of both the upward search and the downward search.

In another aspect of the invention, an apparatus comprises a decoder configured to identify a component k of a codevector from a codebook C having one or more codevectors, the component k introducing highest variance for an input vector; and allow ordering of codevectors in the codebook C based on component k to facilitate searching for a best match vector for the input vector using ordered codevectors.

In another aspect, an apparatus comprises a decoder configured to search for a best match vector for an input vector using ordered codevectors in a codebook C, wherein the codevectors are ordered based on a component k of the codevector, wherein the decoder is configured to search by performing a binary search only considering component k of the input vector; and performing a modified partial distortion search considering full codevectors.

In another aspect, an apparatus comprises a processor and a memory unit communicatively connected to the processor. The memory unit includes computer code for identifying a component k of a codevector from a codebook C having one or more codevectors, the component k introducing highest variance for an input vector; and computer code for allowing ordering of codevectors in the codebook C based on component k to facilitate searching for a best match vector for the input vector using ordered codevectors.

In another aspect, an apparatus comprises a processor and a memory unit communicatively connected to the processor. The memory unit includes computer code for searching for a best match vector for an input vector using ordered codevectors in a codebook C, wherein the codevectors are ordered based on a component k of the codevector, wherein the computer code for searching comprises computer code for performing a binary search only considering component k of the input vector; and computer code for performing a modified partial distortion search considering full codevectors.

In another aspect, the invention relates to a computer program product embodied on a computer-readable medium. The computer program product comprises computer code for identifying a component k of a codevector from a codebook C having one or more codevectors, the component k introducing highest variance for an input vector; and computer code for allowing ordering of codevectors in the codebook C based on component k to facilitate searching for a best match vector for the input vector using ordered codevectors.

In another aspect, the invention relates to a computer program product embodied on a computer-readable medium. The computer program product comprises computer code for searching for a best match vector for an input vector using ordered codevectors in a codebook C, wherein the codevectors are ordered based on a component k of the codevector, wherein the computer code for searching comprises computer code for performing a binary search only considering component k of the input vector; and computer code for performing a modified partial distortion search considering full codevectors.

These and other advantages and features of various embodiments of the present invention, together with the organization and manner of operation thereof, will become apparent from the following detailed description when taken in conjunction with the accompanying drawings.

BRIEF DESCRIPTION OF THE DRAWINGS

Example embodiments of the invention are described by referring to the attached drawings, in which.

DETAILED DESCRIPTION OF THE VARIOUS EMBODIMENTS

Figure 1:
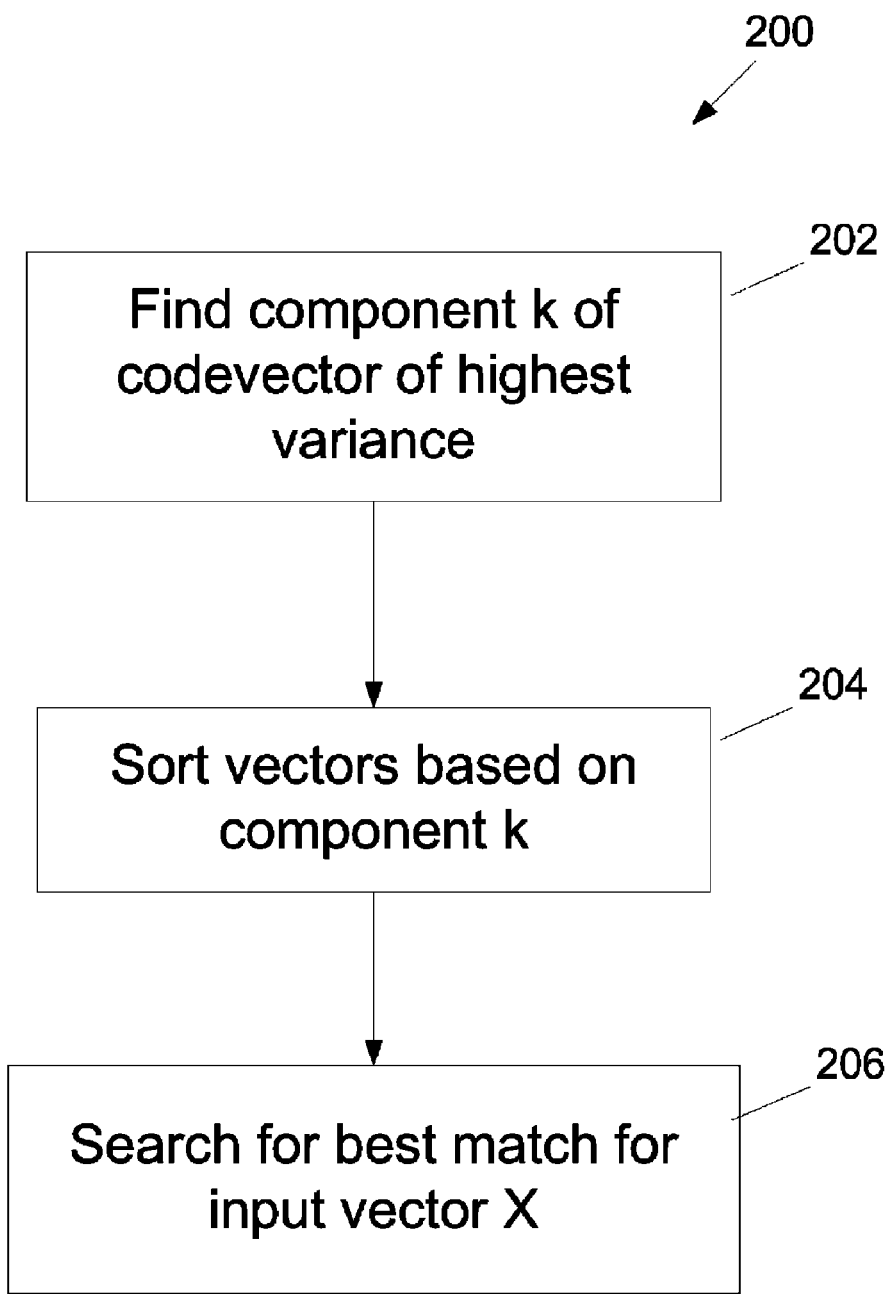
FIG. 1 is a flowchart illustrating an example codeword search method in accordance with an embodiment of the present invention.

In the following description, for purposes of explanation and not limitation, details and descriptions are set forth in order to provide a thorough understanding of the present invention. However, it will be apparent to those skilled in the art that the present invention may be practiced in other embodiments that depart from these details and descriptions.

Even though the performance of a non-constrained vector quantizer can be considered very good in terms of rate distortion, the encoding complexity may prohibit its use if the complexity requirements are restrictive. Embodiments of the present invention provide a method of reducing the complexity of vector quantization encoding without any increase in memory or encoding distortion.

The problem of fast nearest neighbor search has been extensively studied in the literature. There exist several types of fast nearest neighbor search for vector quantizers, for example ones known as (a) partial distortion methods, (b) triangle inequality method, and (c) projection method. There also exist various methods using different ordering of the codebook.

Embodiments of the present invention provide a low complexity method for nearest neighbor search in general vector codebooks. Contrary to conventional solutions, embodiments of the present invention require no supplementary memory storage for auxiliary variables. The fast search in accordance with embodiments of the present invention is optimal in the sense that it guarantees obtaining of the nearest neighbor to the input. For the exemplary application of quantization of gain values and frequency component amplitudes extracted from a segment of audio input data for example in the context of the super-wideband extension of the ITU-T G.718 and G.729.1 codecs, a method in accordance with embodiments of the present invention may reduce complexity for about 8 times with respect to the full search and for about 3 times with respect to the partial distortion method. Embodiments of the present invention make use of a codebook sorted according to the value of the selected vector component, for example the one having the highest variance among the components of codevectors of a codebook. Given an input vector, a binary search is performed with respect to the sorted component, and starting with the resulting point in the codebook a modified partial distortion method is employed to search in the neighborhood of the initial point. The use of one of the components of the codevectors enables the initial binary search directly on scalar values, without any additional memory requirements like in the prior art methods. Since the distortion relative to one component only enters as such in the vector distortion measure, it can be conveniently used as a search stop indicator, without further checking all codevectors of the codebook.

In accordance with some embodiments of the present invention, a K-dimensional codebook C of N codevectors sorted with respect to the value of vector component k is employed. The component k may be the vector component introducing the largest variance within the codevectors of codebook C.

In some embodiments the selection of the component k used as a basis for sorting the codevectors of codebook C may be selected in a different manner. In one embodiment the component k may be chosen randomly among the components of the codevectors. Furthermore, for example in an embodiment making use of a weighted distortion measure in the codebook search, the component having the largest weight may be chosen as component k to be used as a basis for the sorting. In yet another embodiment both the variance and weighting of the components may be considered in selection of the vector component k. In further embodiments the vector component having the largest sensitivity to distortion may be selected as component k to be used as a basis for sorting the codebook.

In one embodiment, given an input vector X from the $R^K$ space—i.e. a set of real-valued vectors with K elements per vector—a binary search considering the value of component k is performed in the codebook C sorted according to increasing value of component k. The index I of the vector having the largest value for component k that is still smaller than or equal to the corresponding component of the input vector X is retrieved such that $$C_{I,k} \leq X_k < C_{I+1,k}.$$

where $C_{l,k}$ refers to the component k of the codevector with index I. Note that in another example embodiment the codebook C may be sorted according to descending order of component k. In this case the binary search is used to find the index of the codebook vector having the smallest value for component k that is still larger than the corresponding component of the input vector X, i.e., $$C_{l,k} > X_k \geq C_{1+l,k}.$$

The principle of the partial distortion approach is to stop the evaluation of the distortion of a given codevector if the distortion calculated for a subset of vector components, for example for the certain number of first components of the codevector, is already larger than the current minimum distortion. The partial distortion approach is modified by stopping the search altogether and selecting the codevector resulting in the current minimum distortion as the output vector if the partial distortion calculated only for the vector component k, as specified above, is larger than the current minimum distortion. This is possible because in an embodiment where the codebook is ordered according to the ascending order of the value of component k, which implies that $C_{n,k} \leq C_{n+1,k}$ holds for all values of 0<n<N. Thus, in upwards search considering codevectors with index values starting from I+1 upwards can be stopped once the first codevector $m_u$ whose component k introduces higher distortion than the current minimum distortion, because the ordering of the codebook ensures that all codevectors with index value I>$m_u$ will introduce even higher distortion when considering only component k. In a similar manner, the downwards search considering codevectors starting from index I downwards can be stopped once the first codevector $m_d$ whose component k introduces distortion higher than the current minimum distortion, since the codebook ordered according to ascending order of value of component k ensures that codevectors with index I<$m_d$ will introduce even higher distortion when considering only component k.

The upwards and downwards search procedures and the stop conditions are similar also in example embodiments employing codebooks with codevectors sorted according to the descending order of value of component k.

In an embodiment employing a codebook sorted according to ascending order of value of component k, if $X_k$ is larger than the component k in any of the codevectors, the modified partial distortion search is performed from the last codevector downwards. Thus, in this case only the downwards search is performed. If $X_k$ is smaller than the component k in any of the codevectors, the modified partial distortion search is performed from the first codevector upwards. Thus, only the upwards search is performed. If the codebook contains both codevectors with component k having value(s) smaller than $X_k$ and codevectors with component k having value(s) larger than $X_k$, the modified partial distortion search is performed both upwards and downwards.

In an embodiment employing a codebook sorted according to descending order of value of component k, the $X_k$ larger than the component k in any of the codevectors results in performing only the upwards search. In a similar manner, $X_k$ smaller than the component k in any of the codevectors results in performing only the downwards search.

In some embodiments a codebook can be conceptually divided into two or more sub-codebooks, and the sorting according to the component k is performed separately for each of the sub-codebooks. In the search phase the process involving both upwards and downwards searches—if applicable for given input vector—are performed separately for each of the sub-codebooks, and an intermediate output vector is selected for each of the sub-codebooks. The final output vector is the one providing the smallest distortion among the intermediate output vectors of the sub-codebooks.

In yet another embodiment employing sorting and search processes using two or more conceptual subcodebooks the sorting—and the search—may be performed based on different vector components. For example vector component $k_1$ may be used for sorting the first sub-codebook, and vector component $k_2$ may be used for the second sub-codebook.

In some embodiment only part of the full codebook may be considered in sorting and/or in search.

Reference is now made to FIG. 1 which illustrates an example process 200 for codeword search in accordance with an embodiment of the present invention. At block 202, the process 200 finds a component k of a codevector introducing the highest variance within a codebook C'. The component k is then used to sort the vectors in the codebook C' (block 204). Next, in accordance with embodiments of the present invention, ordering of codevectors in the codebook is allowed. In accordance with the exemplary embodiment illustrated in FIG. 1, this is achieved by sorting the vectors for example into ascending or descending order of value of the vector component k to form a codebook C. The ordered codebook C is then used to search for the best match for an input vector X (block 206).

In another embodiment, the codebook C' does not need to be sorted. Rather, ordering of codevectors in the codebook may be achieved through a mapping function to form the codevector indices of codebook C' that creates the order of codevectors in C. Thus, an existing codebook with the mapping function could be used to enable using the search method in accordance with embodiments of the present invention.

Figure 2:
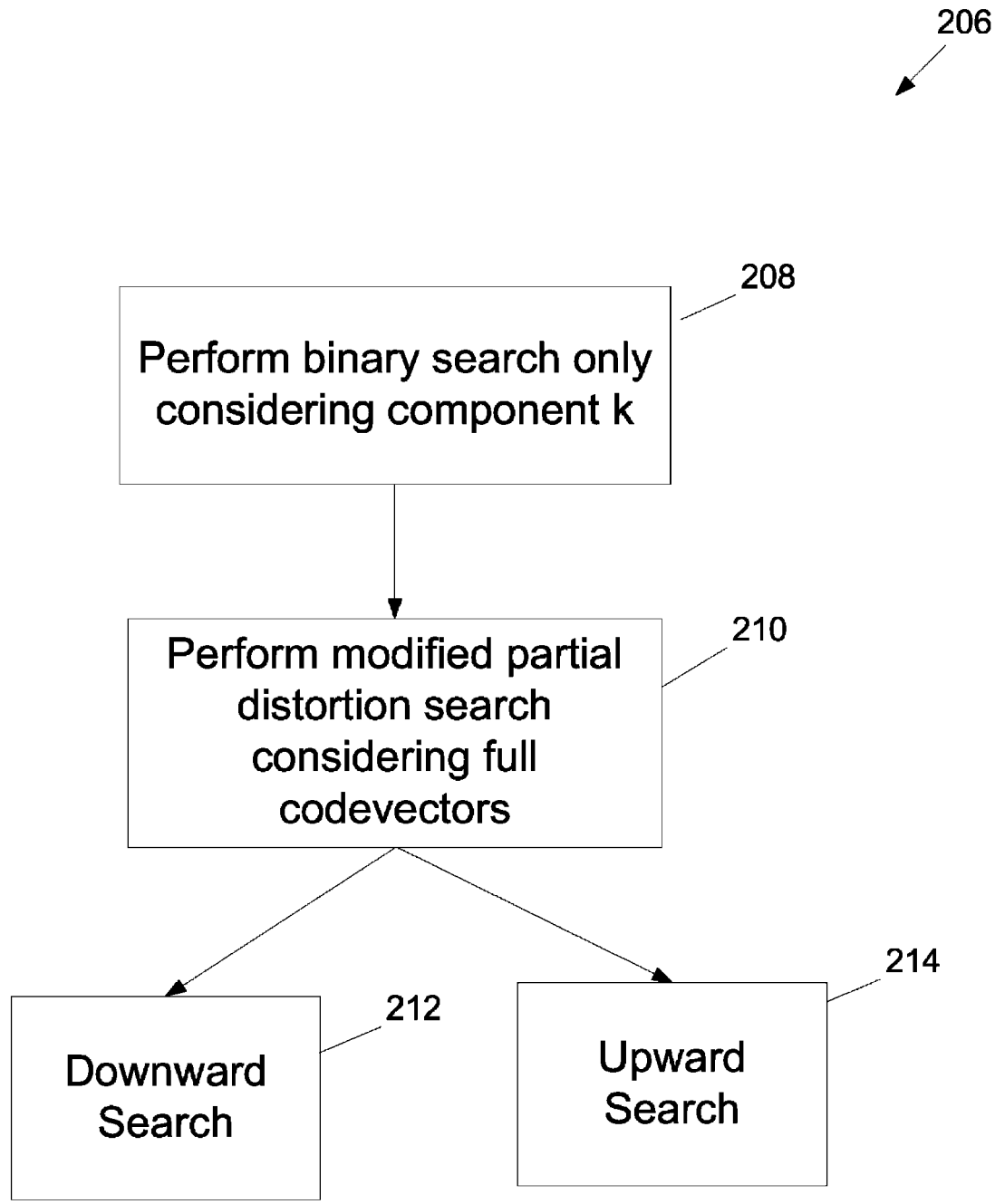
FIG. 2 is a flowchart illustrating an example method for the search for best match for the codeword search method of FIG. 1 in accordance with an embodiment of the present invention.

An exemplary method for the search for the best match of block 206 is illustrated in FIG. 2. When searching for the best match for an input vector X from the ordered codebook C, at block 208, first a binary search is performed only considering component k of the input vector and codebook to find the first codevector $C_j$ having a value larger than $X_k$ for vector component k. Thus, a vector with smallest index j that satisfies the condition $X_k < C_{j,k}$ is found.

At block 210, a modified partial distortion search is performed considering full codevectors starting from the index j found above: the downwards search considers codevectors with index j−1, j−2, j−3, and so on. In a similar manner, the upwards search considers codevectors with index j, j+1, j+2, and so on. In downwards search (block 212), once the first codevector with component k introducing distortion larger than the current minimum distortion computed over a full vector is encountered, the downwards search is terminated and upwards search is started. In upwards search (block 214), once the first codevector with component k introducing distortion larger than the current minimum distortion computed over a full vector is encountered, the search is completed, and the codevector providing the minimum distortion is selected as the output of the search.

The following C code representation provides an implementation of an embodiment of the proposed method. In this example the codebook is sorted with respect to the first component.

```
/* --- FAST_SEARCH ----------------------------------------------------
   int fast_search(REAL *X, REAL *C, int K, int N)
   INPUT:
      REAL *X           input vector
      REAL *C           codebook
      int K             vector dimension
      int N             number of code vectors
   RETURN VALUE:
      index of the best code vector (int)
------------------------------------------------------------------------ */
int fast_search(REAL *X, const REAL *C, int K, int N)
{
    REAL d, dtemp;
    REAL dmin = 9999999.0f, dmin1 = 9999999.0f;
    int n;
    int index = 0, idx1, index1, direction;
    int i = 0;
    REAL x0;
    REAL * p_C;
    x0 = X[0];
    p_C = C;
    /* binary search for first component */
    idx1 = bin_search(C, K, N, x0, &direction);
    if (direction >= 0)
    {
            /* look up */
            i = idx1+1;
    C += i*k;
    /* for first component first time */
    dtemp = x0-C[0];
    d = dtemp*dtemp;
    while( i < N )
    {
        n = 1;
        /* the check of d<dmin1 corresponds to the partial distortion method*/
        while ( (d < dmin1) && (n < K) ) {
            dtemp = X[n] - C[n];
                d += (dtemp * dtemp);
            n++;
        }
        if (d < dmin) { /* update the current best */
            index1 = i;
            dmin1= d;
                }
        C += K;
                /* for first component */
            dtemp = x0-C[0];
            d = dtemp*dtemp;
            /* here is the modification of the partial distortion search, by stopping the search if dmin1 is
less than the distortion on the dirst component only */
        if (d > dmin1){
            break;
                }
                else
        {
            i++;
        }
    }
    }
    if (direction <= 0){
    /* look down */
    i = idx1;
    C = p_C + i*K;
    /* for first component first time */
    dtemp = x0-C[0];
    d = dtemp*dtemp;
    while( i >= 0)
    {
        n = 1;
        while ( (d < dmin) && (n < N) ) {
            dtemp = X[n] - C[n];
                d += (dtemp * dtemp);
            n++;
        }
        if (d < dmin) {
            index = i;
            dmin = d;
                }
        C -= K;
                /* for first component */
```

```
        dtemp = x0−C[0];
        d = dtemp*dtemp;
        if (d > dmin){
            break;
        }
        else
    {
        i−−;
        }
    }
    }
    if (dmin1 < dmin)
    {
    index = index1;
    }
    return index;
}
int bin__search(const REAL * C,    /* (i) - codebook with first component ordered */
        int K,              /* (i) - codevectors dimension */
        int N,              /* (i) - codebook size */
        REAL x0,            /* (i) - first component of input vector */
        int * p__dir        /* (o) - specifies if the input is less than all first components (1),
                                    larger than all first components (−1) or in between (0) */)
{
  int i, low, high, idx, tmp;
  low = 0;
  high = N−1;
  if (x0 < C[0])
  {
    *p__dir = 1;
        return −1;
  }
  if (x0 > C[k*high])
  {
    *p__dir = −1;
    return (N−1);
  }
  while (high−low > 1)
  {
  tmp = (high+low) >> 1;
  if (x0 < C[K*tmp])
        {
        high = tmp;
        }
        else
    {
        low = tmp;
        }
    }
    *p__dir = 0;
    return low;
}
```

The complexity in terms of Weighted Millions of Operations Per Second (WMOPS) may be compared with the partial distortion approach and with the full search approach. The complexity is estimated in per frame values for all the non-structured vector quantizers using the same input data.

| Full search | Partial distortion | Embodiment of Present Invention |
|---|---|---|
| 5.89 WMOPS | 2.61 WMOPS | 0.79 WMOPS |

Thus, embodiments of the present invention provide substantially reduced computational complexity without introducing additional memory requirements.

Figure 3:
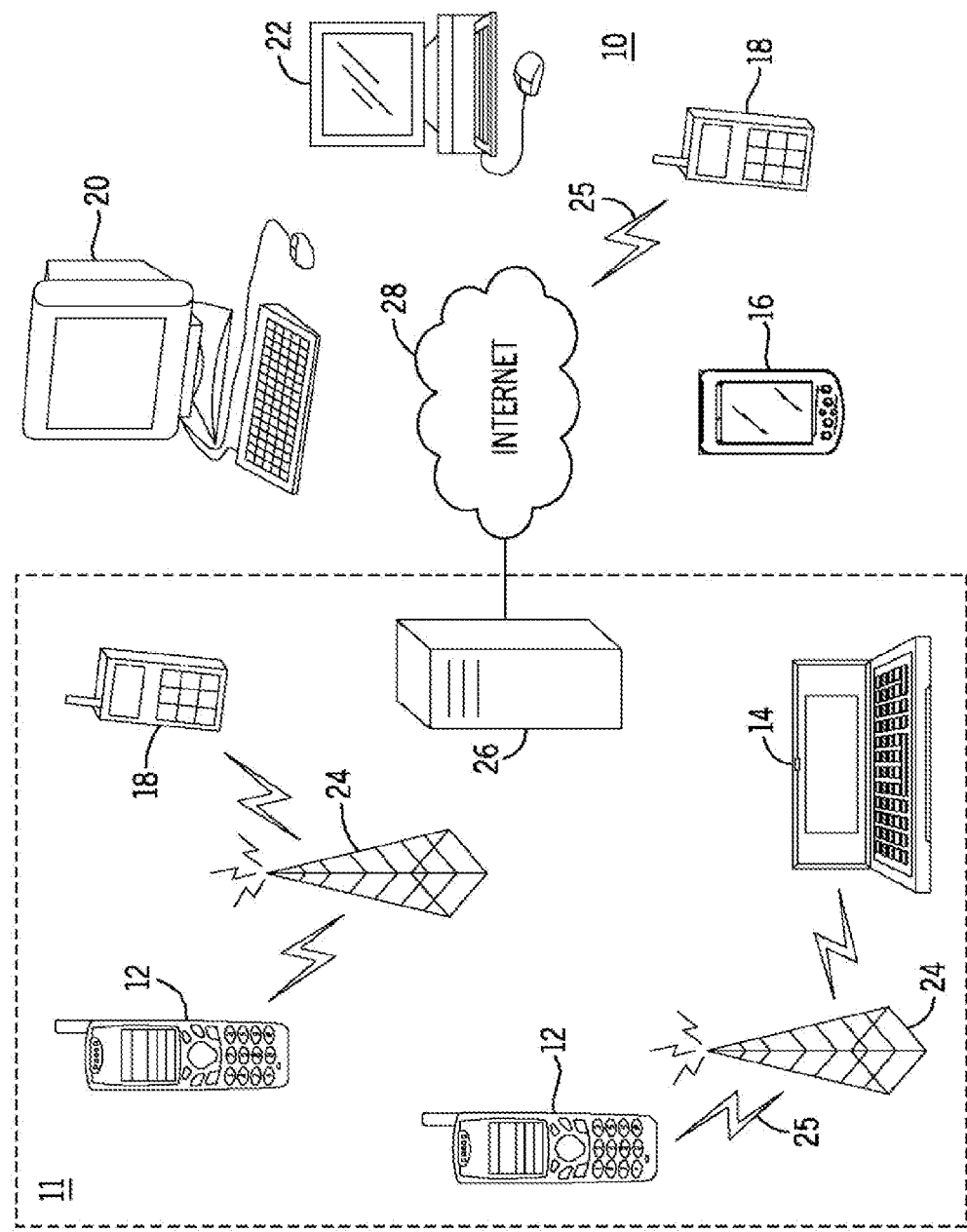
FIG. 3 is an overview diagram of a system within which various embodiments of the present invention may be implemented.

FIG. 3 shows a system 10 in which various embodiments of the present invention can be utilized, comprising multiple communication devices that can communicate through one or more networks. The system 10 may comprise any combination of wired or wireless networks including, but not limited to, a mobile telephone network, a wireless Local Area Network (LAN), a Bluetooth personal area network, an Ethernet LAN, a token ring LAN, a wide area network, the Internet, etc. The system 10 may include both wired and wireless communication devices.

For exemplification, the system 10 shown in FIG. 3 includes a mobile telephone network 11 and the Internet 28. Connectivity to the Internet 28 may include, but is not limited to, long range wireless connections, short range wireless connections, and various wired connections including, but not limited to, telephone lines, cable lines, power lines, and the like.

The example communication devices of the system 10 may include, but are not limited to, an electronic device 12 in the form of a mobile telephone, a combination personal digital assistant (PDA) and mobile telephone 14, a PDA 16, an integrated messaging device (IMD) 18, a desktop computer 20, a notebook computer 22, etc. The communication devices may be stationary or mobile as when carried by an individual who is moving. The communication devices may also be located in a mode of transportation including, but not limited to, an automobile, a truck, a taxi, a bus, a train, a boat, an airplane, a bicycle, a motorcycle, etc. Some or all of the communication devices may send and receive calls and messages and communicate with service providers through a wireless connection 25 to a base station 24. The base station 24 may be connected to a network server 26 that allows communication between the mobile telephone network 11 and the Internet 28. The system 10 may include additional communication devices and communication devices of different types.

The communication devices may communicate using various transmission technologies including, but not limited to, Code Division Multiple Access (CDMA), Global System for Mobile Communications (GSM), Universal Mobile Telecommunications System (UMTS), Time Division Multiple Access (TDMA), Frequency Division Multiple Access (FDMA), Transmission Control Protocol/Internet Protocol (TCP/IP), Short Messaging Service (SMS), Multimedia Messaging Service (MMS), e-mail, Instant Messaging Service (IMS), Bluetooth, IEEE 802.11, etc. A communication device involved in implementing various embodiments of the present invention may communicate using various media including, but not limited to, radio, infrared, laser, cable connection, and the like.

Figure 4:
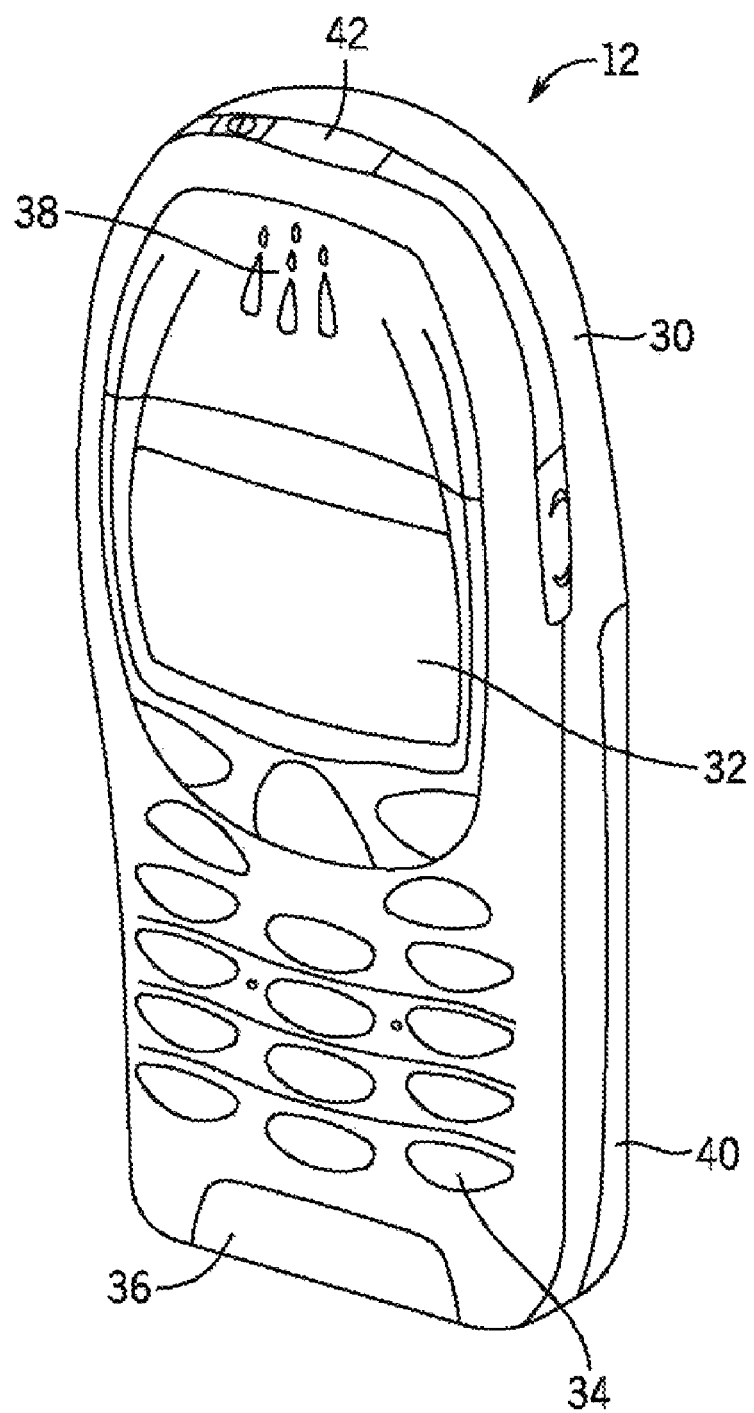
FIG. 4 illustrates a perspective view of an example electronic device which may be utilized in accordance with the various embodiments of the present invention.
Figure 5:
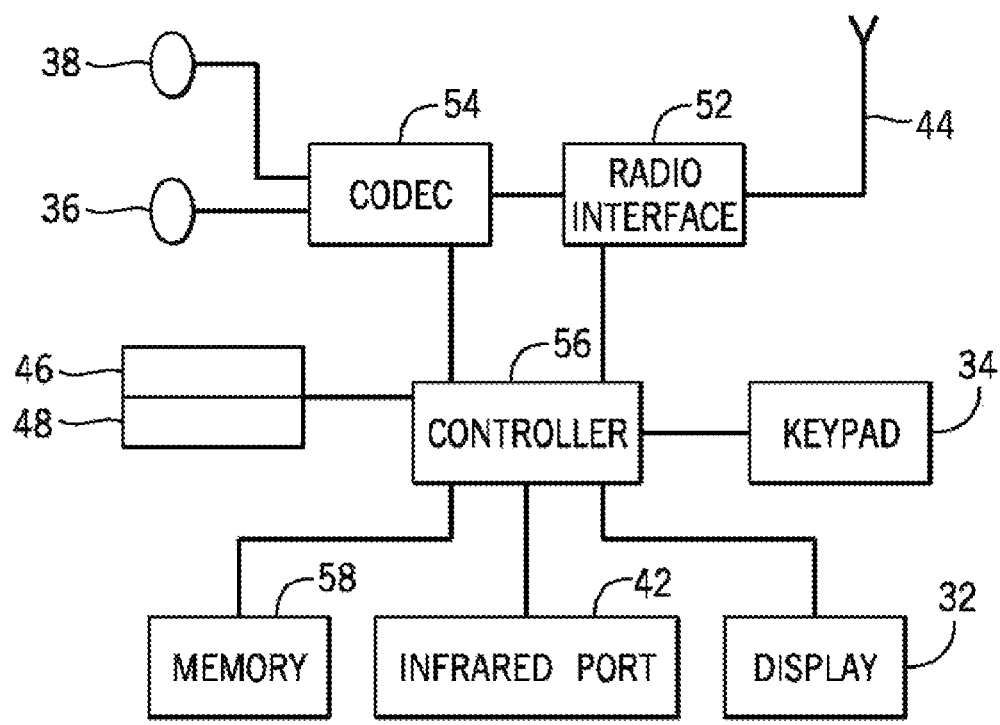
FIG. 5 is a schematic representation of the circuitry which may be included in the electronic device of FIG. 4.

FIGS. 4 and 5 show one representative electronic device 28 which may be used as a network node in accordance to the various embodiments of the present invention. It should be understood, however, that the scope of the present invention is not intended to be limited to one particular type of device. The electronic device 28 of FIGS. 4 and 5 includes a housing 30, a display 32 in the form of a liquid crystal display, a keypad 34, a microphone 36, an ear-piece 38, a battery 40, an infrared port 42, an antenna t, a smart card 46 in the form of a UICC according to one embodiment, a card reader 48, radio interface circuitry 52, codec circuitry 54, a controller 56 and a memory 58. The above described components enable the electronic device 28 to send/receive various messages to/from other devices that may reside on a network in accordance with the various embodiments of the present invention. Individual circuits and elements are all of a type well known in the art, for example in the Nokia range of mobile telephones.

Figure 6:
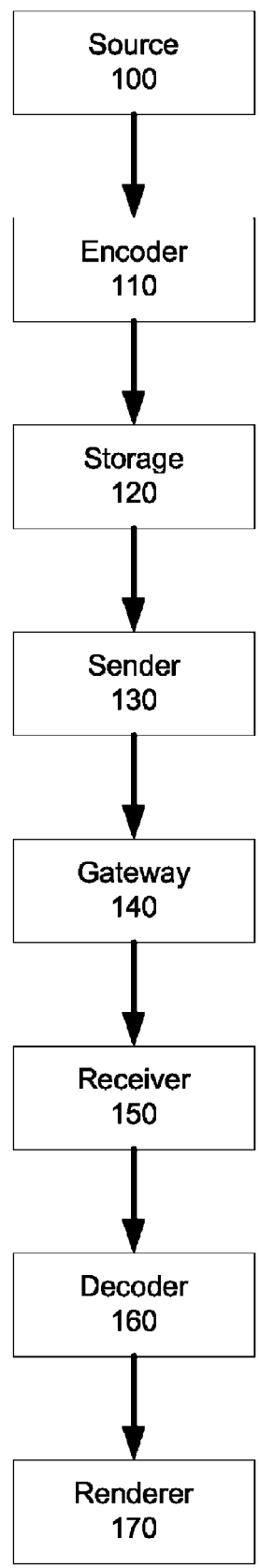
FIG. 6 is a graphical representation of a generic multimedia communication system within which various embodiments may be implemented.

FIG. 6 is a graphical representation of a generic multimedia communication system within which various embodiments may be implemented. As shown in FIG. 6, a data source 100 provides a source signal in an analog, uncompressed digital, or compressed digital format, or any combination of these formats. An encoder 110 encodes the source signal into a coded media bitstream. It should be noted that a bitstream to be decoded can be received directly or indirectly from a remote device located within virtually any type of network. Additionally, the bitstream can be received from local hardware or software. The encoder 110 may be capable of encoding more than one media type, such as audio and video, or more than one encoder 110 may be required to code different media types of the source signal. The encoder 110 may also get synthetically produced input, such as graphics and text, or it may be capable of producing coded bitstreams of synthetic media. In the following, only processing of one coded media bitstream of one media type is considered to simplify the description. It should be noted, however, that typically real-time broadcast services comprise several streams (typically at least one audio, video and text sub-titling stream). It should also be noted that the system may include many encoders, but in FIG. 6 only one encoder 110 is represented to simplify the description without a lack of generality. It should be further understood that, although text and examples contained herein may specifically describe an encoding process, one skilled in the art would understand that the same concepts and principles also apply to the corresponding decoding process and vice versa.

The coded media bitstream is transferred to a storage 120. The storage 120 may comprise any type of mass memory to store the coded media bitstream. The format of the coded media bitstream in the storage 120 may be an elementary self-contained bitstream format, or one or more coded media bitstreams may be encapsulated into a container file. Some systems operate "live", i.e. omit storage and transfer coded media bitstream from the encoder 110 directly to the sender 130. The coded media bitstream is then transferred to the sender 130, also referred to as the server, on a need basis. The format used in the transmission may be an elementary self-contained bitstream format, a packet stream format, or one or more coded media bitstreams may be encapsulated into a container file. The encoder 110, the storage 120, and the server 130 may reside in the same physical device or they may be included in separate devices. The encoder 110 and server 130 may operate with live real-time content, in which case the coded media bitstream is typically not stored permanently, but rather buffered for small periods of time in the content encoder 110 and/or in the server 130 to smooth out variations in processing delay, transfer delay, and coded media bitrate.

The server 130 sends the coded media bitstream using a communication protocol stack. The stack may include but is not limited to Real-Time Transport Protocol (RTP), User Datagram Protocol (UDP), and Internet Protocol (IP). When the communication protocol stack is packet-oriented, the server 130 encapsulates the coded media bitstream into packets. For example, when RTP is used, the server 130 encapsulates the coded media bitstream into RTP packets according to an RTP payload format. Typically, each media type has a dedicated RTP payload format. It should be again noted that a system may contain more than one server 130, but for the sake of simplicity, the following description only considers one server 130.

The server 130 may or may not be connected to a gateway 140 through a communication network. The gateway 140 may perform different types of functions, such as translation of a packet stream according to one communication protocol stack to another communication protocol stack, merging and forking of data streams, and manipulation of data stream according to the downlink and/or receiver capabilities, such as controlling the bit rate of the forwarded stream according to prevailing downlink network conditions. Examples of gateways 140 include MCUs, gateways between circuit-switched and packet-switched video telephony, Push-to-talk over Cellular (PoC) servers, IP encapsulators in digital video broadcasting-handheld (DVB-H) systems, or set-top boxes that forward broadcast transmissions locally to home wireless networks. When RTP is used, the gateway 140 is called an RTP mixer or an RTP translator and typically acts as an endpoint of an RTP connection.

The system includes one or more receivers 150, typically capable of receiving, de-modulating, and de-capsulating the transmitted signal into a coded media bitstream. The coded media bitstream is transferred to a recording storage 155. The recording storage 155 may comprise any type of mass memory to store the coded media bitstream. The recording storage 155 may alternatively or additively comprise computation memory, such as random access memory. The format of the coded media bitstream in the recording storage 155 may be an elementary self-contained bitstream format, or one or more coded media bitstreams may be encapsulated into a container file. If there are multiple coded media bitstreams, such as an audio stream and a video stream, associated with each other, a container file is typically used and the receiver 150 comprises or is attached to a container file generator producing a container file from input streams. Some systems operate "live," i.e. omit the recording storage 155 and transfer coded media bitstream from the receiver 150 directly to the decoder 160. In some systems, only the most recent part of the recorded stream, e.g., the most recent 10-minute excerption of the recorded stream, is maintained in the recording storage 155, while any earlier recorded data is discarded from the recording storage 155.

The coded media bitstream is transferred from the recording storage 155 to the decoder 160. If there are many coded media bitstreams, such as an audio stream and a video stream, associated with each other and encapsulated into a container file, a file parser (not shown in the figure) is used to decapsulate each coded media bitstream from the container file. The recording storage 155 or a decoder 160 may comprise the file parser, or the file parser is attached to either recording storage 155 or the decoder 160.

The coded media bitstream is typically processed further by a decoder 160, whose output is one or more uncompressed media streams. Finally, a renderer 170 may reproduce the uncompressed media streams with a loudspeaker or a display, for example. The receiver 150, recording storage 155, decoder 160, and renderer 170 may reside in the same physical device or they may be included in separate devices.

A sender 130 according to various embodiments may be configured to select the transmitted layers for multiple reasons, such as to respond to requests of the receiver 150 or prevailing conditions of the network over which the bitstream is conveyed. A request from the receiver can be, e.g., a request for a change of layers for display or a change of a rendering device having different capabilities compared to the previous one.

Various embodiments described herein are described in the general context of method steps or processes, which may be implemented in one embodiment by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Generally, program modules may include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

Embodiments of the present invention may be implemented in software, hardware, application logic or a combination of software, hardware and application logic. The software, application logic and/or hardware may reside, for example, on a chipset, a mobile device, a desktop, a laptop or a server. Software and web implementations of various embodiments can be accomplished with standard programming techniques with rule-based logic and other logic to accomplish various database searching steps or processes, correlation steps or processes, comparison steps or processes and decision steps or processes. Various embodiments may also be fully or partially implemented within network elements or modules. It should be noted that the words "component" and "module," as used herein and in the following claims, is intended to encompass implementations using one or more lines of software code, and/or hardware implementations, and/or equipment for receiving manual inputs.

The foregoing description of embodiments has been presented for purposes of illustration and description. The foregoing description is not intended to be exhaustive or to limit embodiments of the present invention to the precise form disclosed, and modifications and variations are possible in light of the above teachings or may be acquired from practice of various embodiments. The embodiments discussed herein were chosen and described in order to explain the principles and the nature of various embodiments and its practical application to enable one skilled in the art to utilize the present invention in various embodiments and with various modifications as are suited to the particular use contemplated. The features of the embodiments described herein may be combined in all possible combinations of methods, apparatus, modules, systems, and computer program products.

What is claimed is:

1. A method, comprising:
    searching for a best match vector for an input vector using ordered codevectors in a codebook C, wherein the codevectors are ordered based on a component k of the codevector, wherein the searching comprises:
        performing a binary search only considering component k of the input vector; and
        performing a modified partial distortion search considering full codevectors.

2. The method of claim 1, wherein the codevectors are ordered in ascending order and wherein performing the binary search finds a vector with smallest index j satisfying the condition:

$$X_k < C_{j,k},$$

where X is the input vector and C is the ordered codevectors.

3. The method of claim 2, wherein performing the modified partial distortion search comprises:
    performing a downward search starting at index j−1; and
    performing an upward search starting at index j.

4. The method of claim 3, wherein the downward search is terminated upon finding a codevector resulting in a larger distortion for component k than the then-current codevector providing the best match.

5. The method of claim 3, wherein the upward search is terminated upon finding a codevector resulting in a larger distortion for component k than the then-current codevector providing the best match.

6. The method of claim 3, further comprising:
    selecting a codevector as the output of the searching for a best match upon termination of both the upward search and the downward search.

7. An apparatus, comprising:
    a processor; and
    a memory unit communicatively connected to the processor and including:
        computer code for searching for a best match vector for an input vector using ordered codevectors in a codebook C, wherein the codevectors are ordered based on a component k of the codevector, wherein the computer code for searching comprises
        computer code for performing a binary search only considering component k of the input vector; and
        computer code for performing a modified partial distortion search considering full codevectors.

8. The apparatus of claim 7, wherein codevectors are ordered in ascending order and wherein the computer code for performing the binary search is configured to find a vector with smallest index j satisfying the condition:

$$X_k < C_{j,k},$$

where X is the input vector and C is the ordered codevectors.

9. The apparatus of claim 8, wherein computer code for performing the modified partial distortion search comprises:
computer code for performing a downward search starting at index j−1; and
computer code for performing an upward search starting at index j.

10. The apparatus of claim 9, wherein the computer code for performing a downward search is configured to terminate the downward search upon finding a codevector resulting in a larger distortion for component k than the then-current codevector providing the best match.

11. The apparatus of claim 9, wherein the computer code for performing an upward search is configured to terminate the upward search upon finding a codevector resulting in a larger distortion for component k than the then-current codevector providing the best match.

12. The apparatus of claim 9, further comprising:
computer code for selecting a codevector as the output of the searching for a best match upon termination of both the upward search and the downward search.

13. A computer program product, embodied on a computer-readable medium, comprising:
computer code for searching for a best match vector for an input vector using ordered codevectors in a codebook C, wherein the codevectors are ordered based on a component k of the codevector, wherein the computer code for searching comprises
computer code for performing a binary search only considering component k of the input vector; and
computer code for performing a modified partial distortion search considering full codevectors.

14. The computer program product of claim 13, wherein codevectors are ordered in ascending order and wherein the computer code for performing the binary search is configured to find a vector with smallest index j satisfying the condition:

$$X_k < C_{j,k},$$

where X is the input vector and C is the ordered codevectors.

15. The computer program product of claim 14, wherein computer code for performing the modified partial distortion search comprises:
computer code for performing a downward search starting at index j−1; and
computer code for performing an upward search starting at index j.

16. The computer program product of claim 15, wherein the computer code for performing a downward search is configured to terminate the downward search upon finding a codevector resulting in a larger distortion for component k than the then-current codevector providing the best match.

17. The computer program product of claim 15, wherein the computer code for performing an upward search is configured to terminate the upward search upon finding a codevector resulting in a larger distortion for component k than the then-current codevector providing the best match.

18. The computer program product of claim 15, further comprising:
computer code for selecting a codevector as the output of the searching for a best match upon termination of both the upward search and the downward search.

* * * * *